United States Patent [19]

DasGupta et al.

[11] Patent Number: 4,509,098
[45] Date of Patent: Apr. 2, 1985

[54] ELECTRICAL PRINTED WIRING CIRCUIT BOARD CONSTRUCTION

[75] Inventors: Sujan DasGupta; Merton B. Purvis, both of Worthington, Ohio

[73] Assignee: AT&T Bell Laboratories, Murray Hill, N.J.

[21] Appl. No.: 469,164

[22] Filed: Feb. 24, 1983

[51] Int. Cl.³ .............................................. H05K 7/14
[52] U.S. Cl. ..................................... 361/398; 29/831; 339/17 F; 339/61 M; 361/399
[58] Field of Search ............... 361/380, 397, 398, 399, 361/400, 413, 419; 29/448, 831, 832, 845; 339/17 F, 59 M, 61 M, 66 M

[56] References Cited

U.S. PATENT DOCUMENTS

| | | | |
|---|---|---|---|
| 2,923,860 | 2/1960 | Miller | 361/401 |
| 3,024,151 | 3/1962 | Robinson | 29/846 |
| 3,039,177 | 6/1962 | Burdett | 361/398 |
| 3,825,878 | 7/1974 | Finger et al. | 339/61 M |
| 3,930,115 | 12/1975 | Uden et al. | 361/400 X |
| 3,971,127 | 7/1976 | Giguere et al. | 361/398 |
| 4,111,510 | 9/1978 | Zurcher | 339/17 F |
| 4,217,017 | 8/1980 | Huebner | 339/17 |

OTHER PUBLICATIONS

Microcircuit Module and Connector, Frank et al., IBM Tech. Discl. Bull. vol. 13, No. 7, 12/70.
IBM Technical Disclosure Bulletin, "Module Package", by L. V. Auletta and G. F. Procopio, vol. 18, No. 11, Apr. 1976.

Primary Examiner—William M. Shoop
Assistant Examiner—Roger B. Can
Attorney, Agent, or Firm—W. H. Kamstra

[57] ABSTRACT

A printed wiring circuit board construction comprising a flexible tape (10) having printed wiring (13) affixed to a surface thereof, which tape (10) is stretched over an open rectangular frame (11). The tape (10) is folded downward over the side-walls (16) of the frame (11) and then up within the frame and there secured by spring clamps (18, 26, 27) fitted over the edges of the side-walls (16) of the frame. Electrical components (19) are mounted on the tape (10) within the frame (11) for maximum protection. Featured is an integral connector arrangement at one end of the structure by which backplane terminal pins (30) may be admitted into a slot (21) in a frame side-wall (15') in order to make contact with the printed wiring terminations (29) on a tape portion extending within the slot (21).

11 Claims, 3 Drawing Figures

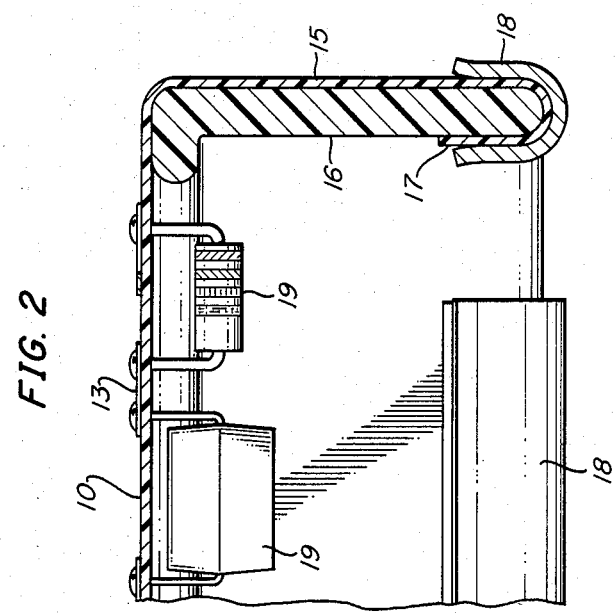
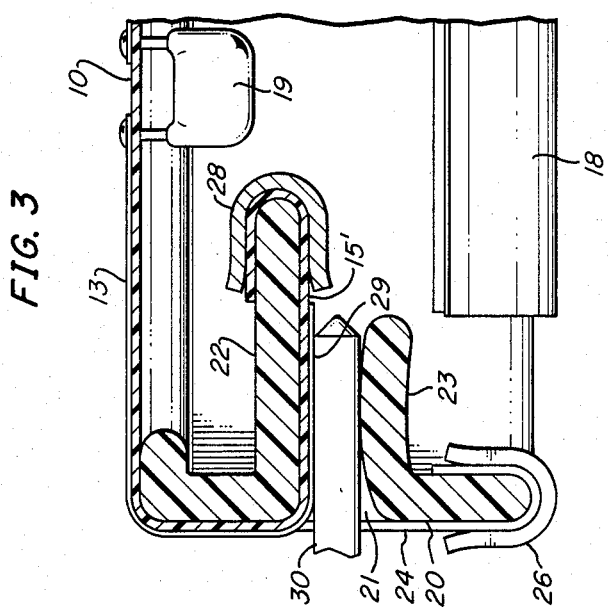

4,509,098

ELECTRICAL PRINTED WIRING CIRCUIT BOARD CONSTRUCTION

TECHNICAL FIELD

This invention relates to electrical printed wiring circuit boards and particularly to their construction and methods of fabrication.

BACKGROUND OF THE INVENTION

Electrical printed wiring circuit boards with their mounted circuit components are well known and have long provided an advantageous means for assembling in an organized and ordered fashion in an electronics system large numbers of electrical circuits. Printed wiring boards have taken a number of forms, the ones most generally in use comprising a rigid substrate of a suitable ceramics on which printed wiring is directly affixed or to which flexible tape circuitry is bonded. In one arrangement employing flexible tape, the substrate is cut away beneath the tape at the points of connection of the circuit components to the tape wiring leaving only the latter for component support. As described in the copending application of V.L. Brown, Ser. No. 297,862, filed Aug. 31, 1981 now U.S. Pat. No. 4,413,308 this arrangement provides the compliance required to prevent solder joint failure which may result from excessive stresses produced when the board is flexed either in manufacture or use, for example. Flexible tape circuitry has also been employed in the past to achieve folded board arrangements to minimize space requirements and to simplify fabrication. Such an arrangement is described, for example, in the patent of W. J. Giguere et al., U.S. Pat. No. 3,971,127, issued July 27, 1976. The objectives of these and other arrangements have included not only an improvement in reliability but also the simplification of the board fabrication with its attendant reduction in cost. It is similarly an object of the present invention further to simplify the fabrication of a printed wiring circuit board. Another object of the invention is to achieve a circuit board construction which provides maximum protection for the electrical components mounted thereon.

SUMMARY OF THE INVENTION

The foregoing and other objects are realized in one illustrative printed wiring circuit board construction according to the invention in which a flexible printed wiring tape is stretched about the outer side walls of a rectangular frame. The tape, which carries the printed wiring on the outer surface of the structure thus formed, is first cut in the form of a rectangle having filleted rectangular cut-outs at each of its four corners to present two pairs of oppositely extending protrusions or arms. The tape arms are folded downward over the frame side walls and are then drawn upward along the inner side walls of the frame where the tape arms are held in place by spring clamps fitted over the folded tape arms. The electrical components are mounted on the inner surface of the tape within the box-like board structure for maximum protection where they are connected through the tape to the external printed wiring.

Advantageously, the board construction of the invention features a novel connector integral with the board itself for making electrical connections with backplane terminal pins, for example. At one side, the frame is formed to present a rectangular slot into which a portion of one tape arm is tucked and there held also by a spring clamp. Terminations of the tape printed wiring in the form of electrical contact areas are arranged on the tape within the slot. When the board construction is mounted into association with a backplane, for example, a row of its terminal pins is admitted into the slot where the pins make respective electrical contact with the tape contact areas. The pins are urged into positive contact by an inwardly extending shelf spring means formed in the slotted side wall of the frame.

BRIEF DESCRIPTION OF THE DRAWING

The organization and features of a printed wiring circuit board construction according to the principles of the invention will be better understood from a consideration of the detailed description of one illustrative embodiment thereof which follows when taken in conjunction with the accompanying drawing in which:

FIG. 2 is an enlarged, portional section view of the board construction of FIG. 1 taken along the line 2—2 in the direction indicated; and FIG. 3 is an enlarged, portional section view of the board construction of FIG. 1 taken along the line 3—3 in the direction indicated showing the details of the connector end of the construction.

DETAILED DESCRIPTION

Figure 1:
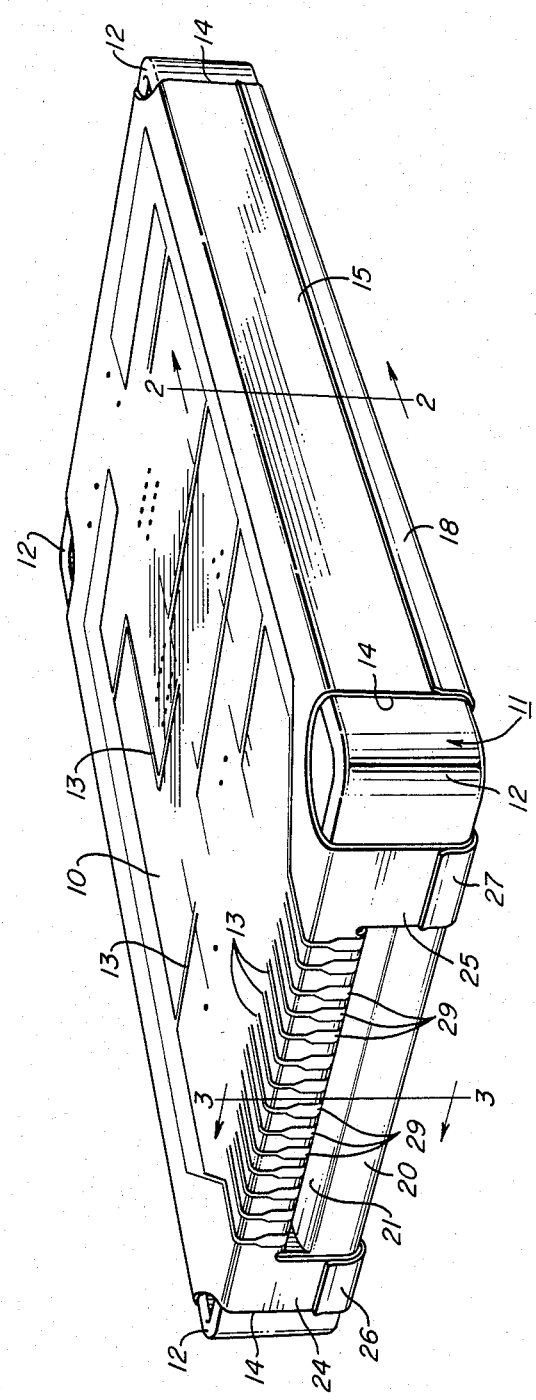
FIG. 1 is a perspective view of an illustrative printed wiring circuit board construction according to the invention showing the printed wiring terminations and the integral connector end of the board construction.

One illustrative printed wiring circuit board construction according to the invention is shown in FIG. 1 as comprising a flexible printed wiring tape 10 stretched across an open rectangular frame 11, the four corners 12 of which are visible in the figure. Tape 10, which may be formed of any suitable flexible insulative material known in the art has affixed thereto on its outer surface printed wiring 13 representative ones of which are shown to symbolize the circuitry defined thereby. Rectangular tape 10 of appropriate dimensions is initially formed to present generally rectangular cut-outs 14 at each of its four corners to assume a substantially cruciate configuration having two pairs of oppositely extending tape arms 15. After tape 10 is stretched across open frame 11, tape arms 15 are drawn downward along three of the outer surfaces of the side walls 16 of frame 11 (See also FIG. 2), turned inwardly in frame 11, and then folded upwardly along the inner surfaces of the three side walls 16 to leave a short segment 17 of each tape arm 15 running along the lower inner edges of the walls. At those edges tape arms 15 are secured by elongated spring clamps 18 which frictionally clamp tape arms 15 and segments 17 firmly to opposite faces of the side walls 16 of frame 11. Electrical circuit components 19 are mounted on the inner surface of tape 10 within the confines of frame 11, their terminals extending through tape 10 for electrical connection with the external printed wiring 13 by any suitable means such as by soldering.

Although frame 11 may be stamped or otherwise fabricated from a suitable metal it may also be conveniently molded of any suitable plastic (FIG. 3) to present at the last of its four side walls 20 a rectangular slot 21 running parallel with the upper and lower edges of frame 11. Side wall 20 is further formed to present a shelf 22 extending inwardly and running the length of slot 21 along its upper edge. A second shelf 23 extending inwardly and running the length of slot 21 along its lower edge is also formed in side wall 20. The lower surface of shelf 22 is flat whereas the opposing face of shelf 23 is formed slightly convex. The tape arm 15' of tape 10 to be stretched over side wall 20 is appropriately slit to leave two portions 24 and 25 which are folded down and about the unslotted segments of side wall 20 and are there secured at the wall edges in the manner described by a pair of spring clamps 26 and 27. The central portion of tape arm 15', which may be somewhat longer than the other tape arms 15 as needed, is tucked into slot 21, extended along the lower surface of shelf 22, and then folded about the inner edge of shelf 22. It is there secured in the manner described by a spring clamp 28.

As shown in FIGS. 1 and 3, a plurality of electrical contact areas 29 affixed to tape arm 15'; and extending a distance along its tucked-in end, provide terminations for the printed wiring circuitry of tape 10. The printed wiring circuit board construction thus described is adapted at its connector end to receive a row of backplane or other terminal pins 30, a portion of a single one of which is shown in FIG. 3. Contact areas 29 are spaced to correspond to the spacings of pins 30 so that when the connector end of the board construction is fitted to the pin row, each of pins 30 will make electrical contact with a respective one of the contact areas 29. Positive electrical contact is maintained by the action of the spring means of lower shelf 23 of frame 11 urging against pins 30 when the distance between the highest point of its convex surface and the surfaces of contact areas 29 is somewhat less than the thickness of pins 30. It will be appreciated that the pins thus held will not be adequate in practice to maintain the board construction in place. For this purpose, suitable frames and guide rails, not shown, are provided as is known in the organization of electrical interconnection systems generally.

The board construction described in the foregoing is as readily disassembled as assembled. With the simple removal of the spring clamps, flexible printed circuit tape 10 may be removed from frame 11 and replaced with a tape carrying different circuits and components. If a more permanent arrangement is desired, the tape arms 15 may be bonded to the frame sidewalls and shelf surfaces with any suitable adhesive. What has been described is thus considered to be one specific illustrative printed wiring board construction according to the principles of the invention. Accordingly, it is to be understood that various and numerous other arrangements may be devised by one skilled in the art without departing from the spirit and scope of the invention as limited only by the accompanying claims.

What is claimed is:

1. A printed wiring circuit board construction comprising a frame having opposite sidewalls each having first and second substantially parallel edges, a flexible tape having printed wiring affixed to one surface stretched over said first edges of said sidewalls and folded about said second edges of said sidewalls, and spring clamp means for clamping said tape to each of said second edges of said sidewalls.

2. A printed wiring circuit board construction as claimed in claim 1 also comprising electrical circuit components mounted on said tape.

3. A printed wiring circuit board construction as claimed in claim 2 in which said circuit components are electrically connected to said tape within said frame between said opposite sidewalls.

4. A printed wiring circuit board construction as claimed in claims 1, 2, or 3 in which one of said sidewalls has a slot formed therein and also comprising a plurality of electrical contact areas affixed to a portion of said tape for terminating said printed wiring, said portion of said tape and said contact areas being arranged within said slot.

5. A printed wiring circuit board construction comprising a rectangular frame having opposite sidewalls having substantially parallel edges defining an open housing, a flexible tape having printed wiring affixed to one surface stretched over one side of said housing and folded about said sidewalls into the other side of said housing, and spring clamp means for clamping said tape to each of said sidewalls.

6. A printed wiring circuit board construction as claimed in claim 5 also comprising electrical circuit components, mounted on said tape within said housing.

7. A printed wiring circuit board construction as claimed in claims 5 or 6 in which one of said sidewalls has a slot formed therein having a first side substantially parallel to the edge of said one of said sidewalls at said one side of said housing and a second side substantially parallel to the edge of said last-mentioned sidewall at the other side of said housing, said construction also comprising a first shelf extending from said last-mentioned sidewall into said housing at said first side of said slot and a plurality of electrical contact areas affixed to a portion of said tape for terminating said printed wiring, said portion of said tape and said contact areas being folded into said slot on a surface of said first shelf.

8. A printed wiring circuit board as claimed in claim 7 also comprising a second shelf extending from said last-mentioned sidewall into said housing at said second side of said slot, said second shelf having a surface distanced from said surface of said first shelf and contoured to offer resistance to the entry of electrical interconnection terminal pins between said contact areas on said surface of said first shelf and said surface of said second shelf.

9. A printed wiring circuit board construction as claimed in claim 8 in which said portion of said tape is folded about the inner edge of said first shelf and also comprising spring clamp means for clamping said portion of said tape to said edge of said first shelf.

10. The method of constructing an electrical printed wiring circuit board comprising the steps of cutting substantially rectangular cut-outs at the corners of a rectangular flexible printed wiring tape to present opposite tape arms, stretching said tape across an open rectangular frame, folding said arms about the sidewalls of said frame, and securing the ends of said arms at the edges of said sidewalls by fitting spring clamps about the folded ends of said tape arms.

11. The method of constructing an electrical printed wiring circuit board as claimed in claim 10 also comprising the steps of mounting electrical components on said printed wiring tape within said frame.

* * * * *